(12) United States Patent
Wang et al.

(10) Patent No.: US 11,987,875 B2
(45) Date of Patent: May 21, 2024

(54) SEMICONDUCTOR DEVICE PATTERNING METHODS

(71) Applicant: Applied Materials, Inc., Santa Clara, CA (US)

(72) Inventors: Yong Wang, Singapore (SG); Doreen Wei Ying Yong, Singapore (SG); Bhaskar Jyoti Bhuyan, San Jose, CA (US); John Sudijono, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/096,347

(22) Filed: Jan. 12, 2023

(65) Prior Publication Data

US 2023/0142926 A1    May 11, 2023

Related U.S. Application Data

(63) Continuation of application No. 17/081,494, filed on Oct. 27, 2020, now abandoned.

(51) Int. Cl.
| | |
|---|---|
| *C23C 16/04* | (2006.01) |
| *C23C 16/02* | (2006.01) |
| *C23C 16/56* | (2006.01) |
| *C23C 22/77* | (2006.01) |
| *C23C 22/82* | (2006.01) |

(52) U.S. Cl.
CPC .......... *C23C 16/0227* (2013.01); *C23C 16/04* (2013.01); *C23C 16/56* (2013.01); *C23C 22/77* (2013.01); *C23C 22/82* (2013.01)

(58) Field of Classification Search
None
See application file for complete search history.

(56) References Cited

U.S. PATENT DOCUMENTS

| | | |
|---|---|---|
| 2013/0236657 A1 | 9/2013 | Anthis |
| 2016/0322213 A1 | 11/2016 | Thompson et al. |
| 2019/0017170 A1 | 1/2019 | Sharma et al. |

(Continued)

FOREIGN PATENT DOCUMENTS

| | | |
|---|---|---|
| KR | 20170063532 A | 6/2017 |
| KR | 20200019271 A | 2/2020 |

(Continued)

OTHER PUBLICATIONS

"PCT International Search Report and Written Opinion in PCT/US2021/056625 dated Feb. 14, 2022, 10 pages".

(Continued)

*Primary Examiner* — David P Turocy
(74) *Attorney, Agent, or Firm* — Servilla Whitney LLC (57) ABSTRACT

Methods of patterning semiconductor devices comprising selective deposition methods are described. A blocking layer is deposited on a metal surface of a semiconductor device before deposition of a dielectric material on a dielectric surface. Methods include exposing a substrate surface including a metal surface and a dielectric surface to a heterocyclic reactant comprising a headgroup and a tailgroup in a processing chamber and selectively depositing the heterocyclic reactant on the metal surface to form a passivation layer, wherein the heterocyclic headgroup selectively reacts and binds to the metal surface.

12 Claims, 2 Drawing Sheets

(56) References Cited

U.S. PATENT DOCUMENTS

| | | | |
|---|---|---|---|
| 2019/0287807 A1 | 9/2019 | Basu et al. | |
| 2019/0316256 A1* | 10/2019 | Bhuyan | C23C 16/45527 |
| 2020/0020580 A1 | 1/2020 | Lee et al. | |
| 2020/0168453 A1 | 5/2020 | Saly et al. | |
| 2020/0273794 A1 | 8/2020 | Khaderbad et al. | |
| 2020/0411374 A1* | 12/2020 | Huang | H01L 21/76829 |
| 2021/0301391 A1* | 9/2021 | Givens | C23C 16/56 |

FOREIGN PATENT DOCUMENTS

| | | |
|---|---|---|
| WO | 2019036188 A1 | 2/2019 |
| WO | 2019200234 A1 | 10/2019 |

OTHER PUBLICATIONS

"U.S. Appl. No. 17/081,482, filed Oct. 27, 2020. "Selective Deposition of a Passivation Film on a Metal Surface"".

"U.S. Appl. No. 17/081,498, filed Oct. 27, 2020. "Area-Selective Atomic Layer Deposition of Passivation Layers"".

"U.S. Appl. No. 17/081,506, filed Oct. 27, 2020. "Selective Deposition of a Passivation Film"".

Adamkiewicz, Maigorzata , "Self-Assembled Monolayers on Silicon: Deposition and Surface Chemistry", http://hdl.handle.net/10023/3938.

Bobb-Semple, Dara , et al., "Area-Selective Atomic Layer Deposition Assisted by Self-Assembled Monolayers: A Comparison of Cu, Co, W, and Ru", Chem. Mater. 2019, 31, 1635-1645, Feb. 5, 2019.

Durainatarajan, P. , et al., "Self-assembly on copper surface by using imidazole derivative for corrosion protection", Journal of Adhesion Science and Technology, 2018, vol. 32, No. 16, 1733-1749, Feb. 19, 2018.

Khuong, Kelli S., et al., "The Mechanism of the Self-Initiated Thermal Polymerization of Styrene. Theoretical Solution of a Classic Problem", J. Am. Chem. Soc. 2005, 127, 1265-1277.

Liang, Liyuan , et al., "The copper(I)-catalyzed alkyne-azide cycloaddition (CuAAC) "click" reaction and its applications. An overview", Coordination Chemistry Reviews 255 (2011) 2933-2945.

Pattison, Thomas G., et al., "Surface Initiated Polymer Thin Films for the Area Selective Deposition and Etching of Metal Oxides", ACS Nano, https://dx.doi.org/10.1021/acsnano.9b09637, Mar. 13, 2020.

Rao, B V Appa, et al., "Self-assembled 1-octadecyl-1H-benzimidazole film on copper surface for corrosion protection", J. Chem. Sci. vol. 125, No. 6, Nov. 2013, pp. 1325-1338, Aug. 21, 2013.

Winther-Jensen, Bjorn , et al., "Vapor Phase Polymerization of Pyrrole and Thiophene Using Iron(III) Sulfonates as Oxidizing Agents", Macromolecules 2004, 37, 5930-5935, Jul. 10, 2004.

Ziarani, Ghodsi Mohammadi, et al., "Advances in click chemistry for silica-based material construction", RSC Adv.. 2016, 6, 21979.

* cited by examiner

SEMICONDUCTOR DEVICE PATTERNING METHODS

CROSS-REFERENCE TO RELATED APPLICATIONS

This application is a continuation of U.S. patent application Ser. No. 17/081,494, filed Oct. 27, 2020, the entire disclosures of which are hereby incorporated by reference herein.

FIELD

Embodiments of the disclosure relate methods of semiconductor device patterning methods comprising selectively depositing a passivation film. In particular, embodiments of the disclosure are directed to semiconductor device patterning methods comprising selectively depositing a blocking layer on a metal surface of the semiconductor device.

BACKGROUND

The semiconductor industry faces many challenges in the pursuit of device miniaturization which involves rapid scaling of nanoscale features. Such issues include the introduction of complex fabrication steps such as multiple lithography steps and integration of high performance materials. To maintain the cadence of device miniaturization, selective deposition has shown promise as it has the potential to remove costly lithographic steps by simplifying integration schemes.

Selective deposition of materials can be accomplished in a variety of ways. A chemical precursor may react selectively with one surface relative to another surface (e.g., metallic and dielectric). Process parameters such as pressure, substrate temperature, precursor partial pressures, and/or gas flows can be modulated to modulate the chemical kinetics of a particular surface reaction. Another possible scheme involves surface pretreatments that can be used to activate or deactivate a surface of interest to an incoming film deposition precursor.

To achieve complex patterning architectures for next generation semiconductor devices, the traditional top-down approaches consisting of multiple lithography and etch steps lead to high cost and face challenges with technology node scaling. There is an ongoing need in the art for methods to improve deposition selectivity.

SUMMARY

In an embodiment, a semiconductor device patterning method comprises: in a substrate processing chamber, exposing a semiconductor device substrate surface including a metal surface and a dielectric surface to a vapor phase heterocyclic reactant comprising a heterocyclic headgroup and a tailgroup; in the substrate processing chamber, selectively depositing the vapor phase heterocyclic reactant on the metal surface to cover the metal surface with a blocking layer, wherein the heterocyclic headgroup selectively binds to the metal surface; in the substrate processing chamber, depositing a dielectric material on the dielectric surface not covered by the blocking layer at a dielectric deposition temperature up to 350° C. at which the heterocyclic reactant remains bound to the metal surface and maintains stability; and decomposing the blocking layer covering the metal surface in the substrate processing chamber at temperature higher than the dielectric deposition temperature to form a pattern on the semiconductor device substrate surface.

In another embodiment, a semiconductor device patterning method comprises: in a substrate processing chamber, exposing a semiconductor device substrate surface including a metal surface and a dielectric surface to a heterocyclic reactant comprising a headgroup and a tailgroup; selectively depositing the heterocyclic reactant on the metal surface to form a blocking layer, wherein the heterocyclic headgroup selectively binds to the metal surface and wherein the heterocyclic headgroup comprises one or more of N, O, S, Se and P atoms, and wherein the tailgroup comprises one or more of a phenyl group and a carbon chain and the carbon chain has a length is in the range of from 1 to 50 carbon atoms; in the substrate processing chamber, depositing a dielectric material on the dielectric surface not covered by the blocking layer at a dielectric deposition temperature; and decomposing the blocking layer covering the metal surface in the substrate processing chamber at temperature higher than the dielectric deposition temperature to form a pattern on the semiconductor device substrate surface In another aspect, the disclosure pertains to a non-transitory computer readable medium including instructions, that, when executed by a controller of a substrate processing chamber, causes the substrate processing chamber conduct the methods described herein.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

A "substrate" or "substrate surface", as used herein, refers to any portion of a substrate or portion of a material surface formed on a substrate upon which film processing is performed. For example, a substrate surface on which processing can be performed include materials such as silicon, silicon oxide, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. Substrates may have various dimensions, such as 200 mm or 300 mm diameter wafers, as well as rectangular or square panes. In some embodiments, the substrate comprises a rigid discrete material.

"Atomic layer deposition" or "cyclical deposition" as used herein refers to a process comprising the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction, cycloaddition). The substrate, or portion of the substrate, is exposed sequentially to the two or more reactive compounds which are introduced into a reaction zone of a processing chamber.

A "metal" as used herein refers to metal, metal alloy, metal oxide, metal nitride, or combination thereof, for example, comprising copper, cobalt, nickel, tungsten, vanadium, ruthenium, chromium, iron, platinum, gold, silver, molybdenum, gallium, indium, indium tin oxide, fluorine doped tin oxide and Al-doped zinc oxide.

A "metal surface", as used herein, refers to any portion of a substrate or portion of a material surface formed with the metal. The metal surface may be exposed to a pretreatment process to polish, coat, dope, etch, reduce, oxidize, hydroxylate, anneal, UV cure, e-beam cure and/or bake the substrate surface. In addition to the pretreatment directly on the metal surface itself, in the present disclosure, any of the metal surface treatment disclosed may also be performed on an underlayer metal surface as disclosed in more detail below, and the term "metal surface" is intended to include such underlayer as the context indicates. Thus for example, where a film/layer or partial film/layer has been deposited onto the metal surface, the exposed surface of the newly deposited film/layer becomes the metal surface.

As used in this specification and the appended claims, the phrase "selectively over", or similar, means that the subject material is deposited on the stated surface to a greater extent than on another surface. In some embodiments, "selectively" means that the subject material forms on the selective surface at a rate greater than or equal to about 10×, 15×, 20×, 25×, 30×, 35×, 40×, 45× or 50× the rate of formation on the non-selected surface.

Embodiments of the disclosure advantageously provide methods for selectively depositing a film on a substrate surface, which comprises a dielectric surface and a metal surface. One or more embodiments may include pretreatment, such as selective blocking the metal surface. For blocking, the substrate is pretreated with a heterocyclic reactant. The heterocyclic reactant comprises a headgroup and a tail group. The headgroup selectively reacts and binds to the metal surface forming a passivation film. In some embodiments, the substrate is exposed to the heterocyclic reactant in a processing chamber to form the passivation film. The method allows selective deposition of a dielectric film on a dielectric surface and not on the metal surface. Embodiments of the disclosure advantageously provide a bottom up approach using area-selective atomic layer deposition (AS-ALD) to achieve complex patterning architectures for next-generation semiconductor devices. A bottom up approach using AS-ALD provides advantages of low cost and nanometer scale control. Embodiments describes herein provide a feasible solution for AS-ALD of dielectric-on-dielectric substrate surfaces (e.g. high-k on low-k), and not on metal substrate surfaces.

One or more embodiments provide methods utilizing heterocyclic (e.g., N, O, S, P containing) molecules for self-assembled monolayers (SAMs) formation selectively on Cu/Co surfaces (and not on dielectric surfaces) with strong binding affinity and high stability even at elevated temperatures (e.g., 250° C. for subsequent dielectric deposition). In some embodiments, fine tuning of ligand structure allows control of hydrophobicity preventing subsequent dielectric deposition and deposition of ligands with suitable vapor pressures in an ALD tool using vapor phase SAMs. Embodiments of the disclosure provide both vapor-phase SAM deposition and subsequent dielectric deposition in the same ALD tool which significantly reduce processing time and cost. Flexibility in ligand modification offers suitable vapor pressure for vapor phase delivery.

Thus, area-selective deposition provides a reasonable solution for deposition on complex architectures from a bottom-up strategy because of the atom level control of molecules during processing. Embodiments described herein provide a selective functionalization method to overcome past challenges. In one or more embodiments, a self-assembled monolayers (SAMs) technique is first utilized to produce the selective mask coating on target surface (e.g., metal). Then, the desired material (e.g., dielectric, for example a metal oxide such as $HfO_2$) nucleates on the other surface (e.g. dielectric) not covered by the mask. In embodiments, this passivation layer maintains at least 50 Å of selective deposition with ALD process at elevated temperatures. Moreover, either SAMs or subsequent material deposition (e.g., dielectric) can be all performed in the same ALD tool without the use of any solvents or secondary equipment. This environment-friendly method will greatly save cost, both in time and equipment.

In some embodiments, SAMs provide dense, uniform and functionalized films on target surfaces via surface chemistry. SAM ligands normally consist of headgroup and tail with or without functional group. The headgroup binds to target surfaces selectively with the careful control of molecular interaction. In embodiments described herein, heterocyclic compounds (N, O, S, Se and P atoms-containing) have been used for the SAM formation followed by area-selective ALD of other materials (e.g., dielectrics). These heterocyclic (N, O, S, Se and P atoms containing) bind preferentially to metal atoms (e.g., Cu, Co) strongly, but not Si atoms. Thus, these SAMs provide selective and precise surface coating on Cu and Co substrates. The binding affinity properties and hydrophobicity of SAMs can be tuned by adjusting one of the position, length, size and number of substitute R groups of the tail end on any substitution site of a typical headgroup.

According to one or more embodiments, by synthesizing and selecting appropriate length and size of tail ends for each type of headgroups, we can determine SAMs with suitable vapor pressures for ALD processing. SAM ligands can be vapor deposited to form SAM films on the metal surfaces such as Cu or Co with high stability, density and uniformity. Moreover, these tails could provide adequate hydrophobicity to prevent the subsequent nucleation and deposition of a precursor (e.g., dielectric) from adsorbing on the target surface (e.g., metal). Yet, this subsequent material (e.g., dielectric) can be deposited by ALD without any solution treatment on the other surface in a complex patterned structure. The SAM layer may optionally be decomposed at higher temperatures to recover the semiconductor architecture. This complete vapor-phase SAM and ALD process provides a feasible solution for AS-ALD of dielectric-on-dielectric (e.g., high-k on low-k) and not on metals. In some embodiments, the method includes decomposing the passivation layer at a decomposition temperature, wherein the decomposition temperature is higher than the stability temperature, i.e., the temperature at which the SAM layer exhibits high stability at the elevated temperatures at which the dielectric layer is deposited (e.g., 250° C. for dielectric deposition).

Figure 1:
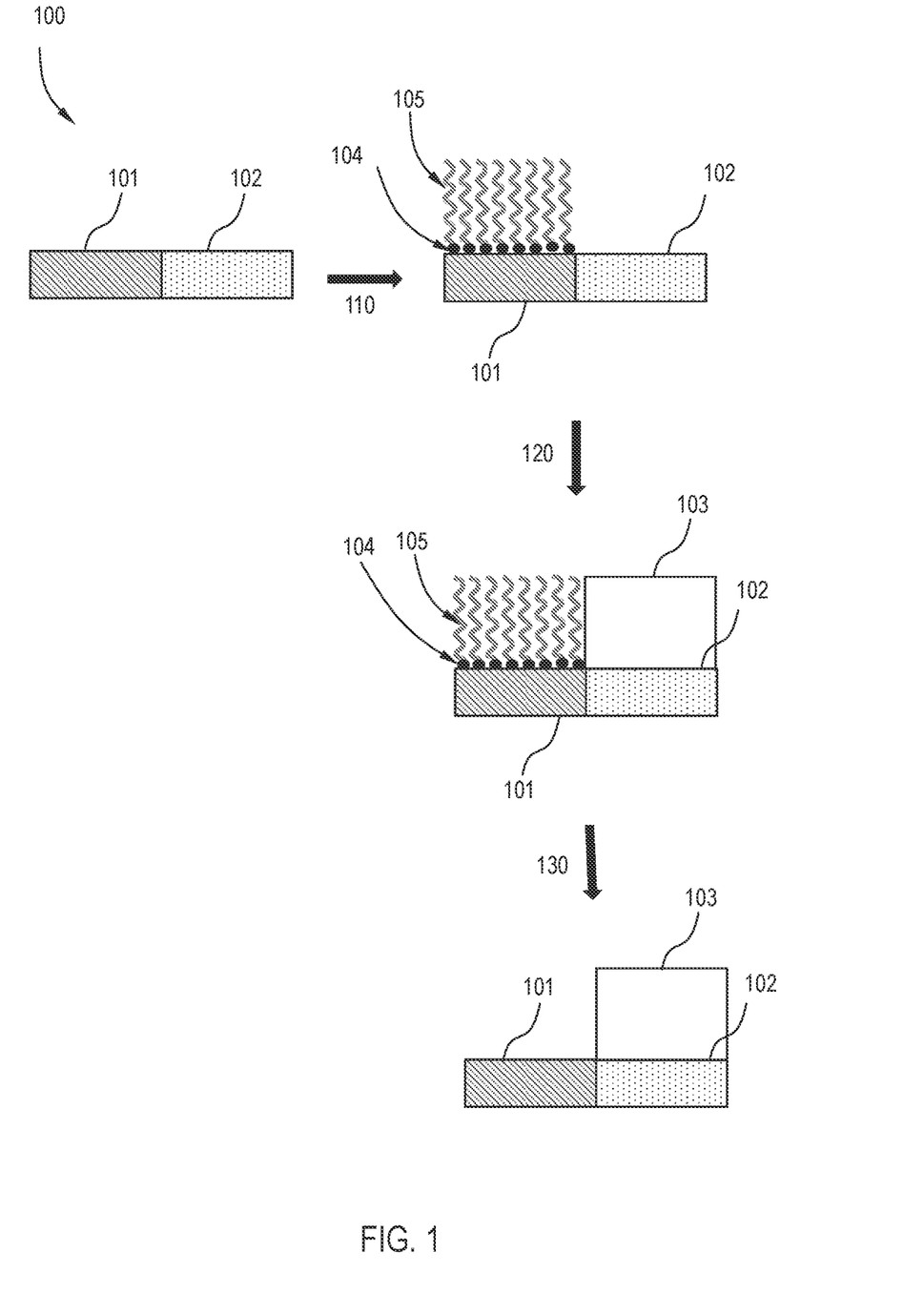
FIG. 1 is a schematic view of a method for selectively depositing the passivation film on the metal surface according to an embodiment of the disclosure.

FIG. 1 illustrates a reaction schematic of a method 100 for selectively depositing a passivation film 106 of heterocyclic reactant on a metal surface 101 (metal, e.g., copper, cobalt, nickel, tungsten, vanadium, ruthenium, chromium, iron, platinum, gold, silver, molybdenum, gallium and indium etc.) according to an exemplary embodiment of the disclosure. The method at 110 includes depositing the heterocyclic reactant on the metal surface 101. The heterocyclic reactant comprises a headgroup 104 and a tailgroup 105, wherein the headgroup 104 (e.g., pyrrole, pyrrolidine, pyrazole, imidazole, furan, biimidazole, thiophene, thiazole, thiadiazole, pyridine, pyridazine, pyrimidine, quinoxaline, indazole, thiazine, phosphinine, phosphinoline or phosphole derivative) selectively reacts and binds to the metal surface 101. The method at 120 includes depositing a dielectric film 103 (e.g., $SiO_x$, $Si_xN_y$, Si, SiON, $AlO_x$, $Al_2O_3$, $HfO_x$, $ZrO_2$, $TiO_x$, TiN, $Ta_xO_5$, $Ta_2O_5$, $Y_2O_3$, $La_2O_3$, AN, MgO, $CaF_2$, LiF, SrO, SiC, BaO, $HfSiO_4$, $LaAlO_3$, $Nb_2O_5$, $BaTiO_3$, $SrTiO_3$, $Bi_4Ti_3O_{12}$, Pb(Zr, Ti)$O_3$, $CaCu_3Ti_4O_{12}$, $LiNbO_3$, $BaTiO_3$, $LiNbO_3$, $KNbO_3$ or combination thereof) on a dielectric surface 102 (eg. $SiO_x$, $Si_xN_y$, Si, SiON, $AlO_x$, $Al_2O_3$, $HfO_x$, $ZrO_2$, $TiO_x$, TiN, $Ta_xO_5$, $Ta_2O_5$, $Y_2O_3$, $La_2O_3$, AN, MgO, $CaF_2$, LiF, SrO, SiC, BaO, $HfSiO_4$, $LaAlO_3$, $Nb_2O_5$, $BaTiO_3$, $SrTiO_3$, $Bi_4Ti_3O_{12}$, Pb(Zr, Ti)$O_3$, $CaCu_3Ti_4O_{12}$, $LiNbO_3$, $BaTiO_3$, $LiNbO_3$, $KNbO_3$ or combination thereof). Finally, in some embodiments the method at 130 optionally includes removing the passivation film 106 from the metal surface 101.

Figure 2:
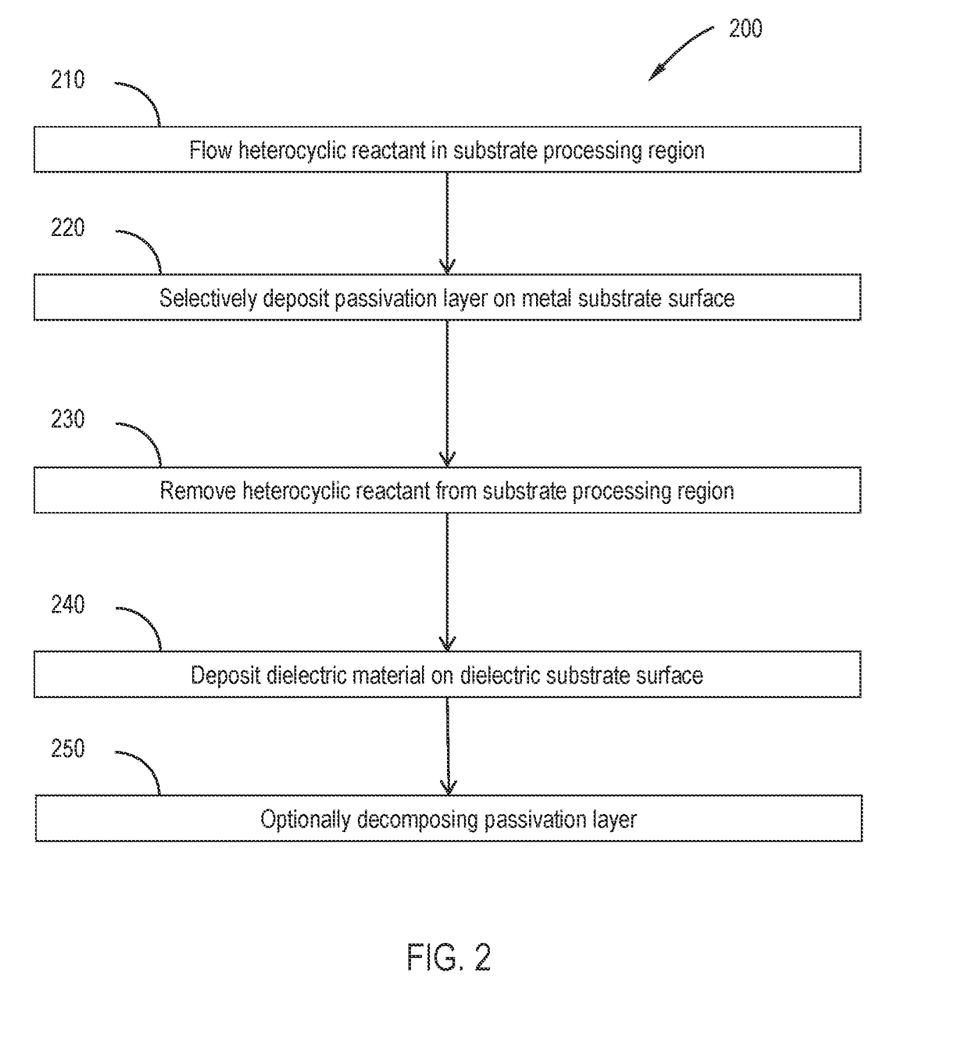
FIG. 2 is a flowchart of a method according to one or more embodiments of the disclosure.

FIG. 2 is a flowchart of an embodiment of a method 200. The method 200 comprises at 210 flowing a heterocyclic reactant in a substrate processing region and at 220 selectively depositing a passivation layer on a metal substrate surface. At 230 the method 200 includes removing the heterocyclic reactant from the substrate processing region, and at 240, dielectric material is deposited on a dielectric substrate surface. At 250 the passivation layer is optionally decomposed.

According to embodiments of the disclosure, the passivation film may be deposited by any suitable method. In some embodiments, the passivation film is deposited by a chemical vapor deposition (CVD) process, cyclical layer deposition (CLD) process or atomic layer deposition (ALD) process.

In some embodiments, the heterocyclic reactant selectively reacts and binds to the metal surface in one or more of solution phase and vapor phase. In some embodiments, the heterocyclic reactant selectively reacts and binds to the metal surface in vapor phase. In some embodiments, the density of passivation film is in the range of from: $1\times10^{10}$ to $1\times10^{16}$, $1\times10^{11}$ to $1\times10^{16}$, $1\times10^{12}$ to $1\times10^{16}$, $1\times10^{13}$ to $1\times10^{16}$, $1\times10^{10}$ to $1\times10^{15}$, $1\times10^{11}$ to $1\times10^{15}$, $1\times10^{12}$ to $1\times10^{15}$, $1\times10^{13}$ to $1\times10^{15}$, $1\times10^{10}$ to $1\times10^{14}$, $1\times10^{11}$ to $1\times10^{14}$, $1\times10^{12}$ to $1\times10^{14}$ or $1\times10^{13}$ to $1\times10^{14}$ molecules per $cm^2$. In some embodiments, the thickness of passivation film is in the range of from: 0.5 Å to 500 Å, 1 Å to 500 Å, 1 Å to 400 Å, 1 Å to 300 Å, 1 Å to 200 Å, 1 Å to 100 Å or 5 Å to 100 Å.

In some embodiments, the heterocyclic tailgroup comprises one or more of a phenyl group and a carbon chain. In some embodiments, the carbon chain may be linear or branched. In some embodiments, the carbon chain may have one or more carbon-carbon single bond, double bond and triple bond. In some embodiments, the length of carbon chain is in the range of from: 1 to 50, 1 to 40, 1 to 30, 1 to 20 or 1 to 10 carbon atoms. In some embodiments the length of the tailgroup is in the range of from: 1 Å to 75 Å. In some embodiments, the tailgroup has one or more substitute R groups. In some embodiments, the tailgroup has substitutions in the range of from: 1 to 50, 1 to 40, 1 to 30, 1 to 20 or 1 to 10. In one or more embodiments, the sum of the length of the carbon chain and tailgroup substitutions is not greater than 50. In some embodiments, the substitute R group comprises one or more of alkyl group, cycloalkyl group, and aryl group. In some embodiments, the substitute R group comprises a linear or branched carbon chain. In some embodiments, the substitute R group comprises one or more carbon-carbon single bond, double bond, and triple bond.

In some embodiments, the heterocyclic headgroup comprises one or more of N, O, S, Se and P atoms. In some embodiments, the headgroup may include one or more of a pyrrole group, a pyrrolidine group, a pyrazole group, an imidazole group, a furan group, a biimidazole group, a thiophene group, a thiazole group, a thiadiazole group, a pyridine group, a pyridazine group, a pyrimidine group, a quinoxaline group, an indazole group, a thiazine group, a phosphinine group, a phosphinoline group, and a phosphole group.

In some embodiments, the heterocyclic headgroup is according to one or more of Formula (I) to Formula (XXXIV):

(VI)

(VII)

(VIII)

(IX)

(X)

(XI)

(XII)

(XIII)

(XIV)

(XV)

(XVI)

(XVII)

(XVIII)

(XIX)

(XX)

(XXI)

(XXII)

(XXIII)

(XXIV)

(XXV)

(XXIV)

(XXVII)

(XXVIII)

(XXIX)

(XXX)

(XXXI)

(XXXII)

-continued (XXXIII)

(XXXIV)

wherein each of R, $R_1$, $R_2$ and $R_3$ group comprises one or more of alkyl group, cycloalkyl group, and aryl group. In some embodiments, each of the R, $R_1$, $R_2$ and $R_3$ group comprises a linear or branched carbon chain. In some embodiments, each of the R, $R_1$, $R_2$ and $R_3$ group comprises one or more of a carbon-carbon single bond, a double bond, and a triple bond In some embodiments, the heterocyclic headgroup selectively reacts and binds to the metal surface. The metal surface includes but not limited to metal, metal alloy, metal oxide, metal nitride, other conductive materials or combination thereof. The metal includes but not limited to copper, cobalt, nickel, tungsten, vanadium, ruthenium, chromium, iron, platinum, gold, silver, molybdenum, gallium, indium or combination thereof. In some embodiments, the heterocyclic headgroup selectively reacts and binds to the metal surface in one or more of solution phase and vapor phase. In some embodiments, the heterocyclic headgroup selectively reacts and binds to the metal surface in vapor phase. In some embodiments, the substrate is exposed to a pretreatment process of cleaning, polishing, coating, doping, etching, reducing, oxidizing, hydroxylating, annealing, UV curing, e-beam curing and/or baking prior to the exposure to the heterocyclic reactant. In some embodiments, the substrate is cleaned prior to exposure to the heterocyclic reactant.

In some embodiments, the heterocyclic reactant remains bound to the metal surface at a higher temperature, wherein the higher temperature is in the range of from: 50° C. to 100° C., 50° C. to 150° C., 50° C. to 200° C., 50° C. to 250° C., 50° C. to 300° C., 50° C. to 350° C., 50° C. to 400° C. or 50° C. to 500° C.

Embodiments of the disclosure provide methods for selectively depositing the dielectric film on the dielectric surface with the passivation film. The dielectric surface of the substrate may comprise any suitable dielectric material. The suitable dielectric material includes but not limited to $SiO_x$, $Si_xN_y$, Si, SiON, $Al_2O_3$, $AlO_x$, $HfO_x$, $ZrO_2$, $TiO_x$, TiN, $Ta_xO_5$, $Ta_2O_5$, $Y_2O_3$, $La_2O_3$, AN, MgO, $CaF_2$, LiF, SrO, SiC, BaO, $HfSiO_4$, $LaAlO_3$, $Nb_2O_5$, $BaTiO_3$, $SrTiO_3$, $Bi_4Ti_3O_{12}$, Pb(Zr, Ti)$O_3$, $CaCu_3Ti_4O_{12}$, $LiNbO_3$, $BaTiO_3$, $LiNbO_3$, $KNbO_3$ or combination thereof. In some embodiments, the dielectric surface consists of silicon oxide.

In some embodiments, the dielectric film is deposited by exposing the substrate with the passivation film to a dielectric reactant. The dielectric reactant comprises $SiO_x$, $Si_xN_y$, Si, SiON, $AlO_x$, $Al_2O_3$, $HfO_x$, $ZrO_2$, $TiO_x$, TiN, $Ta_xO_5$, $Ta_2O_5$, $Y_2O_3$, $La_2O_3$, AN, MgO, $CaF_2$, LiF, SrO, SiC, BaO, $HfSiO_4$, $LaAlO_3$, $Nb_2O_5$, $BaTiO_3$, $SrTiO_3$, $Bi_4Ti_3O_{12}$, Pb(Zr, Ti)$O_3$, $CaCu_3Ti_4O_{12}$, $LiNbO_3$, $BaTiO_3$, $LiNbO_3$, $KNbO_3$ or combination thereof.

In some embodiments, the dielectric reactant is a silane. The silane exposed to the substrate may comprise any suitable trihydridosilanes. In some embodiments, the silane comprises at least one compound with a general formula $SiH_3R$, where R is selected from C4-C20 alkyl, perfluoroalkyl, alkenyl or alkynyl groups. In some embodiments, C4-C20 alkyl groups consist essentially of one Si—C bond, C—C single bonds and C—H bonds. In some embodiments, C4-C20 perfluoroalkyl groups consist essentially of one Si—C bond, C—C single bonds and C—F bonds. In some embodiments, C4-C20 alkenyl groups consist essentially of one Si—C bond, C—C single bonds, at least one C=C double bond and C—H bonds. In some embodiments, C4-C20 alkynyl groups consist essentially of one Si—C bond, C—C single bonds, at least one C—C triple bond and C—H bonds. In some embodiments, the C4-C20 group includes one or more halogen atom and/or hydrophobic moiety. In some embodiments, the silane comprises C4-C20 alkyl groups. Non-limiting specific examples include bis (diethylamino)silane (BDEAS), tetraethyl orthosilicate (TEOS), $SiBr_4$, bis(tert-butylamino)silane (BTBAS), tetramethylsilane (TMS), tris(trimethylsilyl)silane (TTMSS), and triethoxy(fluoro)silane. In some embodiments, the silane groups cross-link with each other after deposition. In some embodiments, the docking layer contains substantially no crosslinking between the silane groups. As used in this manner, the term "substantially no crosslinking" means that there is less than or equal to about 5%, 2% or 1% crosslinking on a surface area basis.

In some embodiments, the thickness of dielectric film is equal to, greater than or lesser than the thickness of passivation film. In some embodiments, the substrate is exposed to the dielectric reactant is repeated one or more times to increase the thickness of dielectric film such that the resulting thickness of dielectric film remains lesser or equal to the thickness of passivation film. In some embodiments, the reactant is the silane and the dielectric film is the silicon nitride film. In some embodiments, the substrate is exposed to the silane more than one time until the silicon nitride film has reached the thickness that is lesser or equal to the thickness of passivation film.

In some embodiments, the passivation film is removed from the substrate after depositing the dielectric film. The passivation film may be removed by any suitable selective etching process. Suitable selective etching processes include, but are not limited to, the use of oxygen plasmas and fluorine plasmas. In some embodiments, when oxygen plasma is used to remove the passivation film, a metal oxide layer is formed on the metal surface. In some embodiments, the metal oxide layer formed on the metal surface is removed through the use of a reduction process. Suitable reduction processes include, but are not limited to, the use of plasmas comprising hydrogen or ammonia and thermal anneals comprising hydrogen or ammonia. In some embodiments, the oxygen plasma, fluorine plasma, hydrogen plasma and ammonia plasma can be independently remotely or internally generated, and conductively coupled or inductively coupled. In some embodiments, the passivation film is removed by sequential exposure of the substrate to an oxygen plasma and a hydrogen plasma.

Embodiments of the disclosure provide that the dielectric film may be deposited by any suitable method. In some embodiments, the dielectric film is deposited by a chemical vapor deposition (CVD) process, cyclical layer deposition (CLD) process or atomic layer deposition (ALD) process. In some embodiments, the dielectric film is deposited by the chemical vapor deposition (CVD) process. In some embodiments, the dielectric film is deposited by the atomic layer deposition (ALD) process.

In some embodiments, the reaction zone is in a modular system comprising multiple chambers which perform various functions including substrate center-finding and orientation, degassing, annealing, deposition and/or etching.

According to one or more embodiments, the modular system includes at least a first processing chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known modular systems which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in the processing chamber of modular system, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, a vacuum is used to remove some or all of the reactants (e.g., reactant). In some embodiments, the inert gas is used to purge or remove some or all of the reactants (e.g., reactant). In some embodiments, the vacuum is used to remove some or all of the reactants followed by the purge with the inert gas (e.g., reactant). According to one or more embodiments, the inert gas is injected at the exit of the processing chamber to prevent reactants (e.g., reactant) from moving from the processing chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In a spatial ALD process according to some embodiments, the reactive gases are flowed into different processing regions within a processing chamber. The different processing regions are separated from adjacent processing regions so that the reactive gases do not mix. The substrate can be moved between the processing regions to separately expose the substrate to the reactive gases. During substrate movement, different portions of the substrate surface, or material on the substrate surface, are exposed to the two or more reactive gases so that any given point on the substrate is substantially not exposed to more than one reactive gas simultaneously. As will be understood by those skilled in the art, there is a possibility that a small portion of the substrate may be exposed to multiple reactive gases simultaneously due to diffusion of the gases within the processing chamber, and that the simultaneous exposure is unintended, unless otherwise specified.

In another aspect of the spatial ALD process, the reactive gases are delivered simultaneously to the reaction zone but are separated by an inert gas curtain and/or a vacuum curtain. The gas curtain can be combination of inert gas flows into the processing chamber and vacuum stream flows out of the processing chamber. The substrate is moved relative to the gas delivery apparatus so that any given point on the substrate is exposed to only one reactive gas.

A "pulse" or "dose" as used herein refers to a quantity of a source gas that is intermittently or non-continuously introduced into the processing chamber. The quantity of a particular compound within each pulse may vary over time, depending on the duration of the pulse. A particular process gas may include a single compound or a mixture/combination of two or more compounds.

In a time-domain ALD process according to one or more embodiments, exposure to each reactive gas, which includes but not limited to the heterocyclic reactants and dielectric reactants to be used for the dielectric film, is separated by a time delay to allow each compound to react and/or bind on the substrate surface and then be purged from the processing chamber. The reactive gases are prevented from mixing by the purging of the processing chamber between subsequent exposures.

In another aspect of a time-domain ALD process according to some embodiments, a time delay exists between pulses of reactive gases. During each time delay, a purge gas, such as argon, is introduced into the processing chamber to purge the reaction zone or otherwise remove any residual reactive gas or reaction products or by-products from the reaction zone. Alternatively, the purge gas may flow continuously throughout the deposition process so that only the purge gas flows during the time delay between pulses of reactive gases. The reactive gases are alternately pulsed with a pulse of purge gas there between until the thickness of dielectric film equal to the thickness of passivation film is formed.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of processing chamber employed, as well as the ability of the components of the reactive gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a reactive gas component thereon.

Once the passivation film is deposited, the method may optionally include further processing (e.g., bulk deposition of a dielectric film). In some embodiments, the further processing may be an ALD process. For example, in some embodiments, an ALD process may be performed to bulk deposit a silicon nitride layer to a target thickness.

In one or more embodiments, the processes may generally be stored in the memory as a software routine that, when executed by a controller or a processor, causes a substrate processing chamber to perform one or more of the processes of the present disclosure. The software routine may also be stored and/or executed by a second controller or processor (not shown) that is remotely located from the hardware being controlled by the controller or processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls a substrate processing chamber operation such that one or more methods of the disclosure are performed.

What is claimed is:

1. A semiconductor device patterning method comprising:
in a substrate processing chamber, exposing a semiconductor device substrate surface including a metal surface and a dielectric surface to a vapor phase heterocyclic reactant comprising a heterocyclic headgroup selected from the group consisting of a phosphinine group, a phosphinoline group, and a phosphole group, and a tailgroup comprising a carbon chain having a length in the range of from 1 to 50 carbon atoms;
in the substrate processing chamber, selectively depositing the vapor phase heterocyclic reactant on the metal surface to cover the metal surface with a blocking layer, wherein the heterocyclic headgroup selectively binds to the metal surface;
in the substrate processing chamber, depositing a dielectric material on the dielectric surface not covered by the blocking layer at a dielectric deposition temperature up to 350° C. at which the heterocyclic reactant remains bound to the metal surface and maintains stability; and
decomposing the blocking layer covering the metal surface in the substrate processing chamber at temperature higher than the dielectric deposition temperature to form a pattern on the semiconductor device substrate surface.

2. The method of claim 1, wherein selectively depositing the vapor phase heterocyclic reactant on the metal surface and depositing the dielectric material on the dielectric surface not covered by the blocking layer utilize an atomic layer deposition process in the substrate processing chamber.

3. The method of claim 2, wherein the metal surface comprises one or more of copper, cobalt, nickel, tungsten, vanadium, ruthenium, chromium, iron, platinum, gold, silver, molybdenum, gallium, indium, indium tin oxide, fluorine doped tin oxide and Al-doped zinc oxide.

4. The method of claim 3, wherein the heterocyclic reactant remains bound to the metal surface at a higher temperature, wherein the higher temperature is in the range of 50° C. to 350° C.

5. The method of claim 2, wherein the density of the blocking layer is in the range of from $1\times10^{13}$ to $1\times10^{14}$ molecules per cm$^2$.

6. The method of claim 2, wherein the thickness of the blocking layer is in the range of from 5 Å to 100 Å.

7. The method of claim 2, wherein the dielectric surface comprises one or more of $SiO_x$, $Si_xN_y$, Si, SiON, $AlO_x$, $Al_2O_3$, $HfO_x$, $ZrO_2$, $TiO_x$, TiN, $Ta_xO_5$, $Ta_2O_5$, $Y_2O_3$, $La_2O_3$, AlN, MgO, $CaF_2$, LiF, SrO, SiC, BaO, $HfSiO_4$, $LaAlO_3$, $Nb_2O_5$, $BaTiO_3$, $SrTiO_3$, $Bi_4Ti_3O_{12}$, $Pb(Zr, Ti)O_3$, $CaCu_3Ti_4O_{12}$, $LiNbO_3$, $BaTiO_3$, $LiNbO_3$ and $KNbO_3$.

8. The method of claim 7, wherein the vapor pressure of the heterocyclic reactant is in the range of from 0.00001 mmHg to 150 mmHg at 25° C.

9. The method of claim 1, wherein the carbon chain has a length and the tailgroup has substitutions such that a sum of the carbon chain length and tailgroup substitutions is not greater than 50 carbon atoms.

10. A semiconductor device patterning method comprising:
in a substrate processing chamber, exposing a semiconductor device substrate surface including a metal surface and a dielectric surface to a heterocyclic reactant comprising a headgroup and a tailgroup;
selectively depositing the heterocyclic reactant on the metal surface to form a blocking layer, wherein the heterocyclic headgroup is selected from the group consisting of a phosphinine group, a phosphinoline group, and a phosphole group, the heterocyclic group selectively binds to the metal surface, and wherein the tailgroup comprises a carbon chain and the carbon chain has a length is in the range of from 1 to 50 carbon atoms;
in the substrate processing chamber, depositing a dielectric material on the dielectric surface not covered by the blocking layer at a dielectric deposition temperature; and
decomposing the blocking layer covering the metal surface in the substrate processing chamber at temperature higher than the dielectric deposition temperature to form a pattern on the semiconductor device substrate surface.

11. The method of claim 10, wherein selectively depositing the vapor phase heterocyclic reactant on the metal surface and depositing the dielectric material on the dielectric surface not covered by the blocking layer utilize an atomic layer deposition process in the substrate processing chamber.

12. The method of claim 11, wherein the density of the blocking layer is in the range of from $1\times10^{13}$ to $1\times10^{14}$ molecules per cm$^2$.

* * * * *

UNITED STATES PATENT AND TRADEMARK OFFICE
CERTIFICATE OF CORRECTION

PATENT NO. : 11,987,875 B2
APPLICATION NO. : 18/096347
DATED : May 21, 2024
INVENTOR(S) : Yong Wang et al.

It is certified that error appears in the above-identified patent and that said Letters Patent is hereby corrected as shown below:

In the Specification

•Column 5, Line 31, replace "AN" after "$La_2O_3$," and before "MgO" with "AlN".

•Column 5, Line 36, replace "AN" after "$La_2O_3$," and before "MgO" with "AlN".

•Column 9, Line 49, replace "AN" after "$La_2O_3$," and before "MgO" with "AlN".

•Column 9, Line 58, replace "AN" after "$La_2O_3$," and before "MgO" with "AlN".

Signed and Sealed this
Ninth Day of July, 2024

Katherine Kelly Vidal
*Director of the United States Patent and Trademark Office*